US006566879B1

United States Patent
Vanek et al.

(10) Patent No.: US 6,566,879 B1
(45) Date of Patent: May 20, 2003

(54) APPARATUS FOR EFFECTING HEAT TRANSFER FROM POWER SEMICONDUCTORS

(75) Inventors: Denis W. Vanek, Cleveland, OH (US); Douglas M. Blakeley, Euclid, OH (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 09/516,003

(22) Filed: Feb. 29, 2000

(51) Int. Cl.⁷ ................................................. G01V 3/00
(52) U.S. Cl. ...................................... 324/318; 324/322
(58) Field of Search ................................ 324/318, 319, 324/320, 322, 300, 307, 309

(56) References Cited

U.S. PATENT DOCUMENTS

| | | | |
|---|---|---|---|
| 4,415,025 A | | 11/1983 | Horvath |
| 5,483,103 A | * | 1/1996 | Blickhan et al. ............ 257/718 |
| 5,500,556 A | * | 3/1996 | Kosugi ........................ 257/718 |
| 5,850,104 A | | 12/1998 | Avis |
| 5,909,358 A | | 6/1999 | Bradt |
| 5,920,120 A | * | 7/1999 | Webb et al. ................. 257/718 |

* cited by examiner

Primary Examiner—Louis Arana
(74) Attorney, Agent, or Firm—Fay, Sharpe, Fagan, Minnich & McKee, LLP

(57) ABSTRACT

A magnetic resonance imaging system includes a main magnetic field generator (10, 12) which produces a temporally constant magnetic field through an examination region (14). A gradient coil assembly (18) powered by a gradient field amplifier (20) produces gradient fields orthogonal to the main magnetic field. The gradient field amplifier (20) includes a heat sink (40) for dissipating the thermal energy of at least one power semiconductor device (44) having a first surface opposite a thermally conductive surface (42). The thermally conductive surface (42) is in contact with the heat sink (40) for transferring the thermal energy. A rigid plate clamp assembly (50) is affixed to the heat sink (40) and the semiconductor device (44) is disposed therebetween. A resiliently deformable spring (60) is positioned between a first surface of the semiconductor package (44) and the plate clamp (50) maintaining positive pressure between the thermally conductive surface (42) and the heat sink (40). The resilient deformable spring (60) has an inner ring (62) in contact with the rigid plate assembly (50) and an outer ring (64) angled from the inner ring in contact with the first surface of the semiconductor package (44). Preferably, a plurality of semiconductor devices are provided each utilizing a deformable spring to ensure thermal contact between each semiconductor power device and the heat sink.

16 Claims, 3 Drawing Sheets

APPARATUS FOR EFFECTING HEAT TRANSFER FROM POWER SEMICONDUCTORS

BACKGROUND OF THE INVENTION

The present invention relates to the art of heat dissipation from high power semiconductor devices. The invention finds particular application in conjunction with power amplifiers configured to power gradient coils within a magnetic resonance imaging apparatus and will be described with particular reference thereto. The invention will also find application in conjunction with the manufacture, an arrangement of power semiconductors such as field effect transistors (FET) where good thermal contact between the semiconductor package and a heat sink is desired.

Power semiconductors come in many packages with a common problem. That problem is making good thermal contact with a heat sink so that the power semiconductors can transfer excess thermal energy and continue to operate efficiently. This effective thermal contact can be accomplished by applying pressure against the power semiconductor toward a flat surface of a heat sink. One known way thought to provide good thermal contact between the semiconductor and the heat sink is to bolt the semiconductor directly to the heat sink through a hole or channel in the package. This method applies pressure most intensively near the channel, however clamping pressure decreases as distance from the channel increases. Indeed, depending on a channel directly through the semiconductor is also problematic in that the presence of this channel is not universal among semiconductors of different ratings and from different manufacturers.

Another known method of attempting to ensure positive thermal contact between a semiconductor and a heat sink involves a clamping plate over the semiconductor to apply pressure to the top of the package. Unfortunately, when more than one package is clamped, as is desirable in gradient coil amplifiers, uneven pressure is applied by the clamping member over the thermal contact area. Additionally, small but significant variations in package tolerances, thermal expansion, and deformations in the heat sink and clamp contribute to a non-uniform pressure supplied by the plate to the several semiconductor packages present.

The present invention contemplates improved apparatus for clamping power semiconductors to a heat sink which overcomes the above-referenced problems and others.

SUMMARY OF THE INVENTION

In accordance with one embodiment of the present invention, a magnetic resonance imaging system includes a main magnetic field generator producing a temporally constant magnetic field through an imaging region. A gradient coil assembly is also provided and powered by a gradient field amplifier. The gradient field amplifier includes a heat sink for dissipating thermal energy generated by at least one power semiconductor device such as a field affect transistor. The semiconductor device includes a first surface opposite a thermally conductive surface which is in thermal contact with the heat sink. A rigid plate clamp mechanically connects to the heat sink and the semiconductor device is positioned therebetween. A resiliently deformable spring is disposed between the first surface of the power semiconductor and the plate clamp. The spring maintains positive mechanical pressure on the semiconductor toward the heat sink.

In accordance with another aspect of the present invention, the deformable spring comprises an annular element defining an inner ring and an outer ring. The inner ring is in contact with the rigid plate while the outer ring makes contact with the first surface of the semiconductor device.

In accordance with another aspect of the present invention, the deformable spring consists of a spring disc washer.

In accordance with another aspect of the present invention, a gradient field amplifier includes a rigid plate clamp removably affixed to a heat sink. At least one transistor package is contained between the heat sink and the rigid plate clamp. The transistor package includes a thermally conductive surface in thermal contact with the heat sink for dissipating thermal energy from the transistor. The resilient spring washer is mechanically engaged between the rigid plate clamp in the transistor package urging the thermally conductive surface of the package toward the heat sink.

In accordance with another aspect of the present invention, a diameter of the resilient spring washer corresponds substantially to that of the transistor package.

In accordance with another embodiment of the present invention, the power semiconductor device includes a package having a first surface opposite a thermally conductive surface. A resiliently deformable spring is affixed to the first surface of the package for maintaining positive mechanical pressure between the thermally conductive surface of the semiconductive surface of the semiconductor and the heat sink.

One advantage of the present invention resides in enhanced clamp pressure for transistors onto a heat sink.

Another advantage of the present invention resides in the ability to clamp multiple grouped transistors with a single plate while maintaining individual clamp pressure to assure maximum heat transfer.

Still further advantages of the present invention will become apparent to those of ordinary skill in the art upon reading and understanding the following detailed description.

BRIEF DESCRIPTION OF THE DRAWINGS

The invention may take physical form in certain parts and arrangements of parts, and in various steps and arrangements of steps. The drawings are only for purposes of illustrating the preferred embodiments and are not to be construed as limiting the invention.

DETAILED DESCRIPTION OF THE PREFERRED EMBODIMENTS

Figure 1:
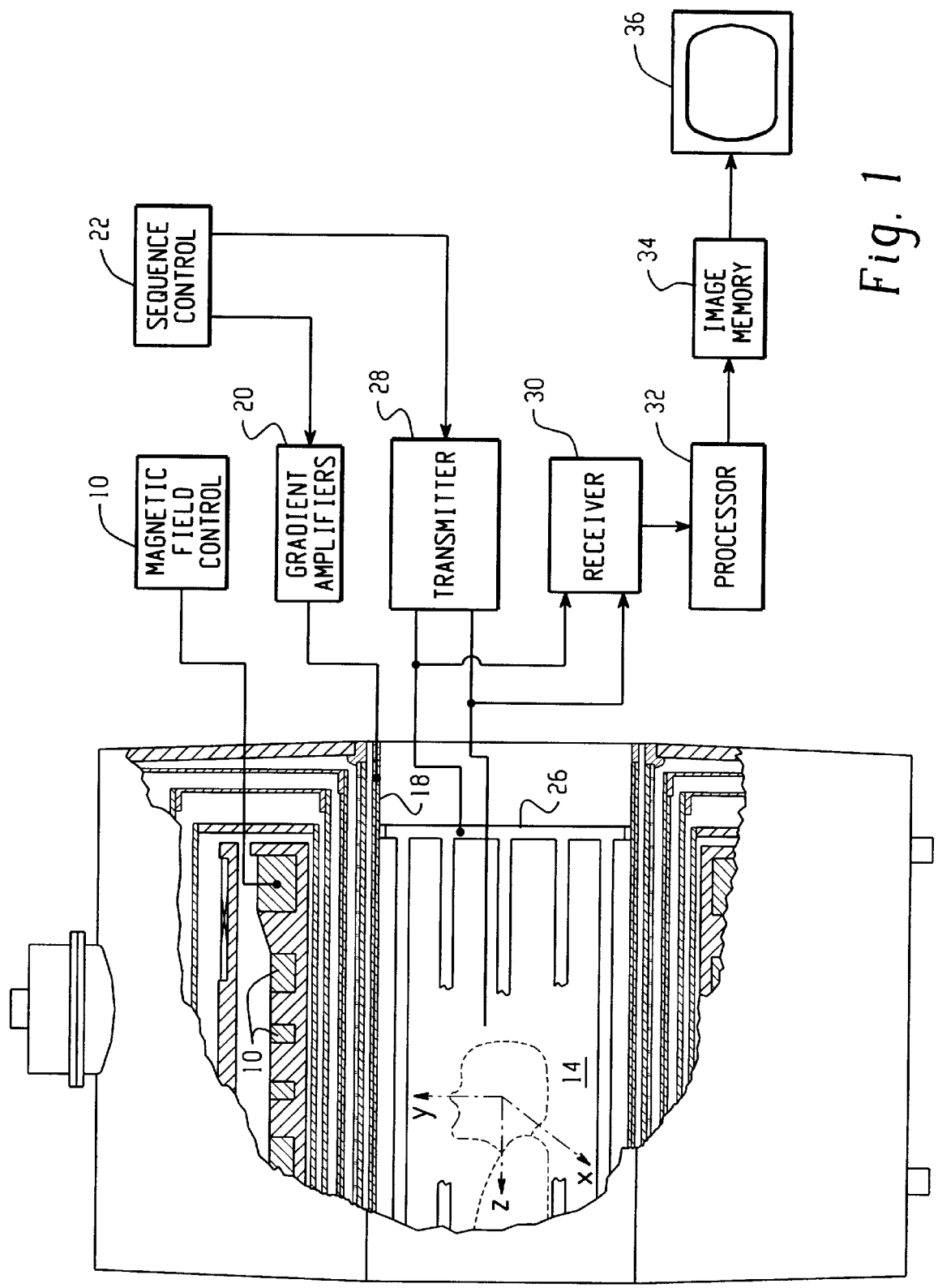
FIG. 1 is a diagrammatic illustration of a magnetic resonance imaging system in accordance with the present invention.

With reference to FIG. 1, a magnetic resonance imaging system includes a main magnetic field assembly 10 controlled by a magnetic field controller 12 for producing a temporally constant magnetic field through an imaging region 14. A gradient coil assembly 18 is provided to induce gradient fields orthogonal to the main magnetic field and otherwise encode magnetic resonance of the spinning nuclei. The gradient coil assembly 18 is powered by gradient amplifiers 20 under the direction of a sequence controller 22. An RF transmitter coil 26 surrounds imaging region 14 and selectively induces the magnetic resonance within the aligned nuclei of a subject. The RF coil 26 is controlled by a transmitter 28 which in turn is controlled by the sequence controller 22. Magnetic resonance signals are received by a receiver 30 and are processed into an image representation by processor 32 for storage in an image memory 34. A human readable display selectively accesses the memory to depict the stored image.

Figure 2:
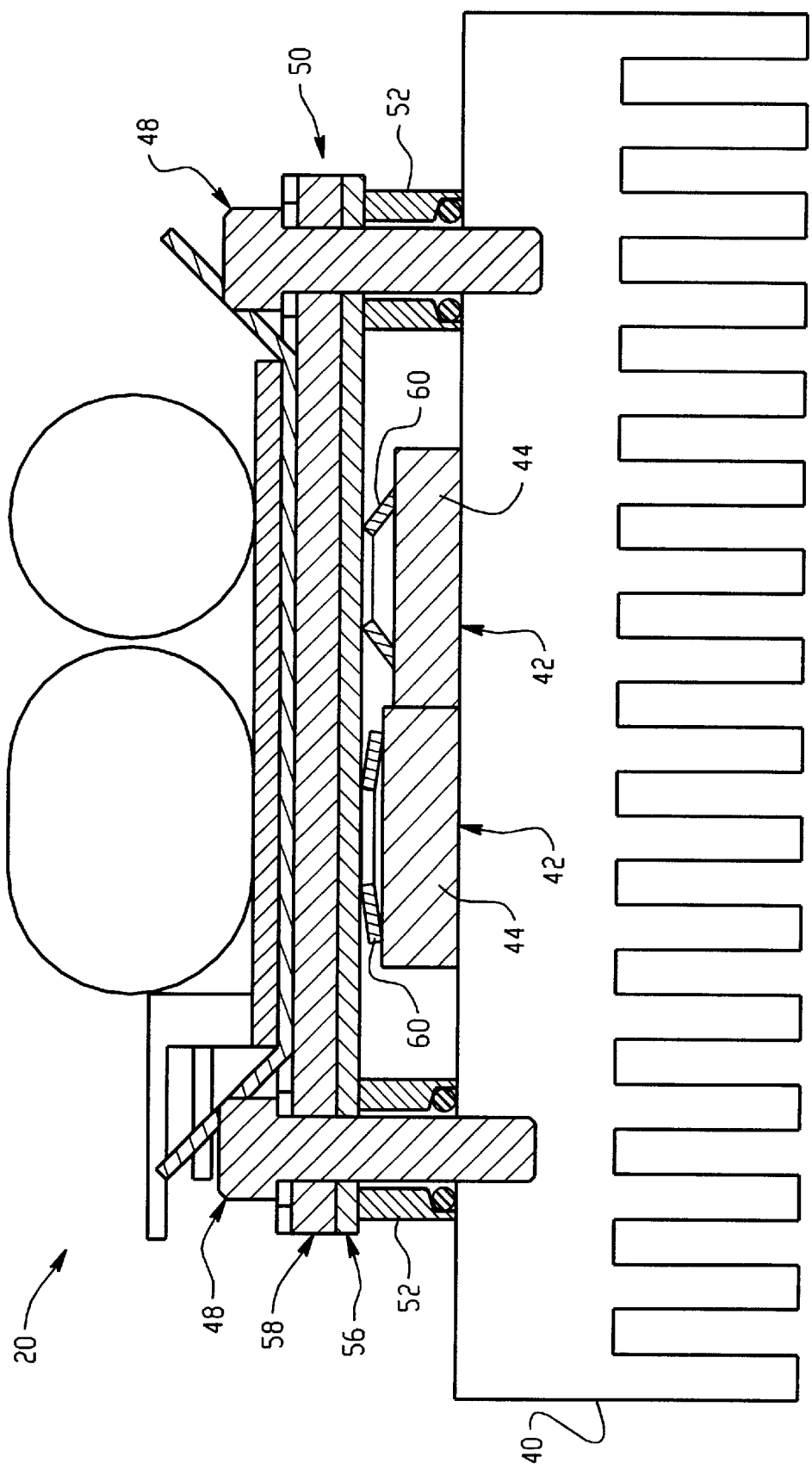
FIG. 2 is a cross section of a gradient coil amplifier for suitably practicing the present invention.

With reference now to FIG. 2, a gradient pulse amplifier 20 applies current pulses to selected gradient coil assemblies to create magnetic field gradients in the three dimensions of the examination region. These high powered devices generate significant thermal energy which, if not removed, limit the device lifetime. A cold plate or heat sink 40 acts to remove heat from a thermally conductive side 42 of a power semiconductor device 44. For purposes of this specification the term heat sink is understood to include not only the heat removing device itself, but also thermal greases or tape interfacing with the thermally conductive side of the transistor to effect efficient thermal transfer therebetween. The semiconductor 44 in general, and the thermally conductive side 42 of the semiconductor in particular, is maintained in firm thermal contact with the heat sink 40 by screws 48 or other suitable affixing mechanisms. In the illustrated example, the screws hold a rigid plate clamp assembly 50 in place. A spacer 52 is also provided to prevent an over tightening of the screws 48, or a warping of the rigid plate clamp assembly 50. In the illustrated example, the rigid plate assembly 50 includes an electrical insulator layer 56 backed by a metal plate 58. The insulator layer 56 prevents inadvertent grounding of the amplifier 20.

As can be appreciated by those skilled in the art, manufacturing variances and/or thermal expansion can alter the dimensions of the semiconductor packages 44. For illustration purposes the variance shown is exaggerated. To accommodate for the variation however, a resiliently deformable spring 60, such as a belleville washer is positioned between the thermal insulator 56 and the transistor packages 44. A separate spring washer 60 is provided for each semiconductor package 44. Thus, a single rigid clamp plate 50 can effect optimum thermal conductivity between the thermal conductor face 42 of the transistors and the heat sink 40. Those skilled in the art will appreciate that the individual pressures provided by the spring washers 60 reduce a need to apply thermal grease to the amplifier assemblies. Moreover, the spring washers 60 have been shown to generate high uniform contact pressure, about 300 psi, over a large surface area of the semiconductor package.

Figure 3:
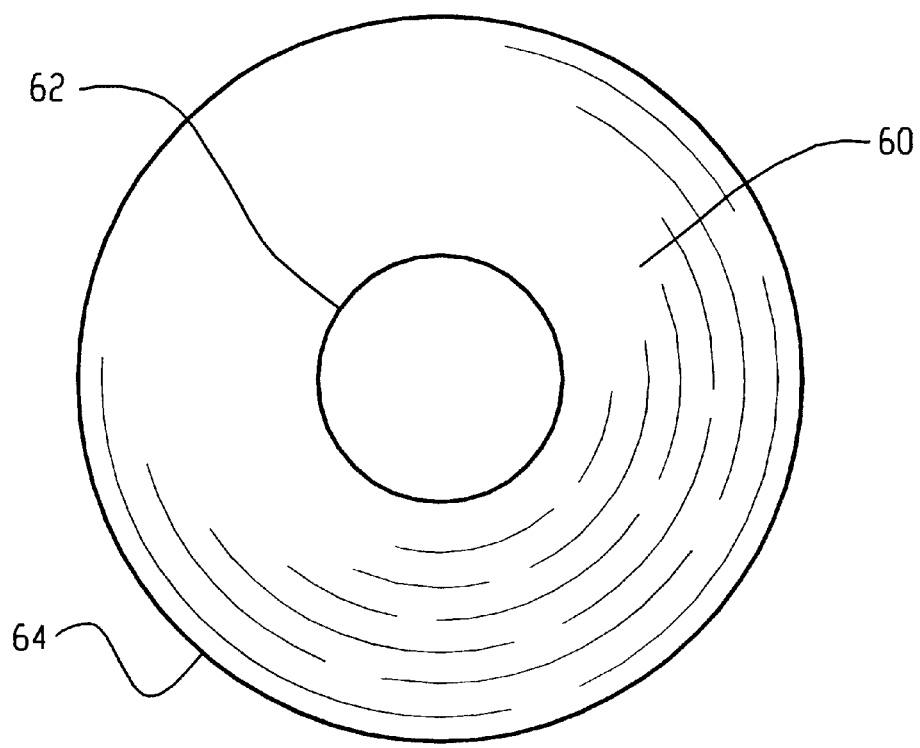
FIG. 3 is an enlarged top view of a compression mechanism suitable to practice the present invention; and, FIG. 4 is a side view of the compression mechanism of FIG. 3.
Figure 4:
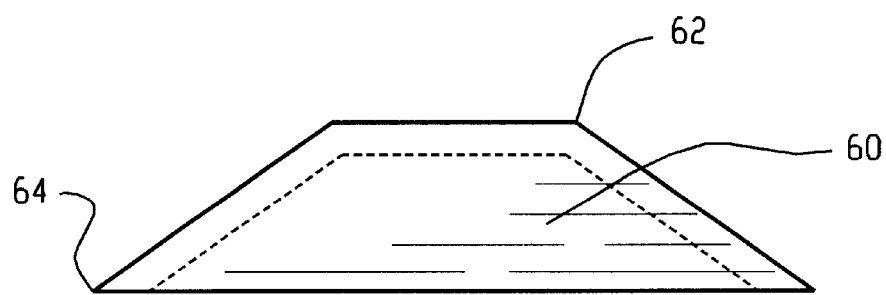

With cross reference now to FIGS. 3 and 4, the spring disc washer 60 is substantially annular in shape and defines an inner opening 62 and an outer edge 64. The diameter of the outer edge 64 is selected to apply pressure to a maximum area of the semiconductor package 44. The sides of the spring washer 60 are slanted, or alternately, curved in a spherical section, to provide resilient pressure from the central opening 62 to the outer opening 64. It is now apparent that depending on tolerances or pressures desired, multiple washers can be combined and stacked in parallel or antiparallel.

The invention has been described with reference to the preferred embodiments. Modifications and alterations will naturally occur to others upon reading and understanding the preceding detailed description. It is intended that the invention be construed as including all such modifications and alterations insofar as the come within the scope of the appended claims, or the equivalents thereof.

Having thus described the preferred embodiment, the invention is now claimed to be:

1. A magnetic resonance imaging system including a main magnetic field generator producing a temporally constant magnetic field through an imaging region, and a gradient coil assembly powered by a gradient field amplifier, the gradient field amplifier comprising:

a heat sink for dissipating thermal energy;

at least one power semiconductor device having a first surface opposite a thermal conductor surface, the thermal conductor surface being in thermal contact with the heat sink;

a rigid plate clamp mechanically connected to the heat sink, the semiconductor device disposed between the plate clamp and the heat sink; and a resiliently deformable spring disposed between the first surface of the power semiconductor and the plate clamp, the spring maintaining positive mechanical pressure between the thermal conducting surface of the power semiconductor and the heat sink.

2. The magnetic resonance imaging system as set forth in claim 1, wherein the deformable spring comprises an annular element having an inner ring in contact with the rigid plate and an outer ring in contact with the first surface.

3. A magnetic resonance imaging system including a main magnetic field generator producing a temporally constant magnetic field through an imaging region, and a gradient coil assembly powered by a gradient field amplifier, the gradient field amplifier comprising:

a heat sink for dissipating thermal energy;

at least one power semiconductor device having a first surface opposite a thermally conductive surface, the thermally conductive surface being in thermal contact with the heat sink;

a rigid plate clamp mechanically connected to the heat sink, the semiconductor device disposed between the plate clamp and the heat sink; and a spring disk washer disposed between the first surface of the power semiconductor and the plate clamp, the spring disk washer maintaining positive mechanical pressure between the thermally conductive surface of the power semiconductor and the heat sink.

4. The magnetic resonance imaging system as set forth in claim 3, wherein the rigid plate comprises:

an electrically insulating plate affixed to the spring disk washer; and a metal backing plate.

5. The magnetic resonance imaging system as set forth in claim 3, wherein the gradient field amplifier includes:

a plurality of power semiconductor devices each with an associated spring disk washer mechanically engaged between the rigid plate clamp and each of said plurality of semiconductor devices; and a hard stop that sets a space between the plate clamp and the heat sink to set the pressure applied by the spring disk washer.

6. The magnetic resonance imaging system as set forth in claim 3, wherein the gradient field amplifier further comprises:

a printed circuit board adjacent to the rigid plate clamp, the printed circuit board being operably interconnected with the power semiconductor device.

7. The magnetic resonance imaging system as set forth in claim 3, wherein the power semiconductor device comprises a field effect transistor.

8. A gradient field amplifier comprising:
   a rigid plate clamp removably affixed to a heat sink;
   at least one transistor package having a thermal conductor surface in thermal contact with the heat sink for dissipating thermal energy from the transistor, the package being contained between the heat sink and the rigid plate clamp; and
   a single resilient spring washer mechanically engaged directly between the rigid plate clamp and the transistor package to apply a uniform distributed pressure that urges the thermal conducting surface firmly against the heat sink.

9. The gradient field amplifier as set forth in claim 8, the resilient spring washer comprising a washer having an angled annular portion defining an inner opening raised relative to an outer ring.

10. An imaging system including:
    a rigid plate clamp removably affixed to a heat sink;
    at least one transistor package having a thermally conductive surface in thermal contact with the heat sink for dissipating thermal energy from the transistor, the package being contained between the heat sink and the rigid plate clamp; and
    a resilient spring washer having an angled annular portion defining an inner opening raised relative to an outer ring and being mechanically engaged between the rigid plate clamp and the transistor package with the inner opening in contact with the rigid plate clamp and the outer ring in contact with transistor package to urge the thermal conducting surface toward the heat sink.

11. The imaging system as set forth in claim 10, wherein a diameter of the outer ring corresponds substantially to that of the transistor package.

12. The imaging system as set forth in claim 10, wherein the rigid plate comprises:
    an electrically insulating plate affixed to the resilient spring; and
    a metal backing plate.

13. A power semiconductor assembly comprising:
    a heat sink;
    a high power semiconductor device housed in a package having a first surface opposite to a thermally conductive surface, the thermally conductive packaging being in thermal contact with the heat sink;
    a rigid plate disposed parallel to the first surface;
    a resiliently deformable annular spring disposed between and against the first surface and the rigid plate;
    a mechanical affixing mechanism for moving the rigid plat toward the heat sink compressing the annular spring to apply a positive mechanical pressure between the package thermally conductive surface;
    a hard stop which limits movement of the rigid plat toward the heat sink to set a maximum limit on the applied positive mechanical pressure.

14. The power semiconductor assembly as set forth in claim 13, wherein the resiliently deformable annular spring consists of a single spring disk washer.

15. The power semiconductor assembly as set forth in claim 13, wherein the resiliently deformable annular spring comprises a washer having an angled annular portion defining an inner opening raised relative to an outer ring.

16. The power semiconductor assembly comprising:
    a heat sink;
    a high power semiconductor device housed in a package having a first surface opposite to a thermally conductive surface, the thermally conductive packaging being in thermal contact with the heat sink;
    a rigid plate disposed parallel to the first surface;
    a resiliently deformable annular spring disposed between and against the first surface and the rigid plate;
    a mechanical affixing mechanism for moving the rigid plate toward the heat sink compressing the annular spring to apply a positive mechanical pressure between the package thermally conductive surface and the heat sink;
    a hard stop which limits movement of the rigid plat toward the heat sink to set a maximum limit on the applied positive mechanical pressure.

\* \* \* \* \*